United States Patent [19]

Kawamura et al.

[11] Patent Number: 5,138,265
[45] Date of Patent: Aug. 11, 1992

[54] APPARATUS AND SYSTEM FOR LOCATING THUNDERSTRUCK POINT AND FAULTY POINT OF TRANSMISSION LINE

[75] Inventors: Takeshi Kawamura; Koshi Itaka, both of Osaka, Japan

[73] Assignee: Sumitomo Electric Industries, Ltd., Osaka, Japan

[21] Appl. No.: 444,620

[22] Filed: Nov. 29, 1989

[30] Foreign Application Priority Data

Nov. 30, 1988 [JP] Japan ............... 63-304732
Dec. 13, 1988 [JP] Japan ............... 63-315825

[51] Int. Cl.⁵ ............................................ G01R 31/08
[52] U.S. Cl. ................................. 324/535; 324/532; 324/520
[58] Field of Search ............ 324/535, 532, 541, 544, 324/520, 521

[56] References Cited

U.S. PATENT DOCUMENTS

| | | | |
|---|---|---|---|
| 4,063,164 | 12/1977 | Lanz et al. | 324/535 |
| 4,446,420 | 5/1984 | Drouet | 324/535 |
| 4,775,839 | 10/1988 | Kosina et al. | 324/520 |

FOREIGN PATENT DOCUMENTS

| | | | |
|---|---|---|---|
| 35241 | 3/1980 | Japan | 324/535 |
| 278468 | 12/1987 | Japan | 324/535 |
| 69968 | 3/1989 | Japan | 324/535 |
| 103477 | 4/1990 | Japan | 324/535 |
| 561912 | 6/1977 | U.S.S.R. | 324/535 |
| 110447 | 7/1984 | U.S.S.R. | 324/535 |

*Primary Examiner*—Kenneth A. Wieder
*Assistant Examiner*—Maura K. Regan
*Attorney, Agent, or Firm*—W. G. Fasse; D. J. Kane, Jr.

[57] ABSTRACT

A plurality of current detectors are provided in a plurality of prescribed spots of a transmission line for locating a fault caused, e.g. by lightning. A plurality of discriminators are provided in correspondence to the plurality of current detectors. Each discriminator receives detected signals from an arbitrary pair of the plurality of current detectors for detecting a relative difference between arrival times of the detected signals while extracting low-frequency components from the detected signals respectively and for detecting a phase difference between the extracted low-frequency components. A locator receives relative time difference data and phase difference data from the plurality of discriminators, to locate a faulty point in the transmission line on the basis of the received data.

15 Claims, 9 Drawing Sheets

OK
SAME TIME

←Δt→ PROBLEMATIC
TIME DEVIATION 41a, 41b: CURRENT DETECTOR
42a, 42b: DISCRIMINATOR
B1~B4: FIBER COUPLER
G1~G8: OPTICAL WAVE LENGTH MULTIPLEXER AND DEMULTIPLEXER

APPARATUS AND SYSTEM FOR LOCATING THUNDERSTRUCK POINT AND FAULTY POINT OF TRANSMISSION LINE

FIELD OF THE INVENTION

The present invention relates to an apparatus and a system for locating a faulty point in a transmission line, particularly an overhead power transmission or distribution line when the same is struck by lightning.

BACKGROUND INFORMATION

When a transmission line develops a fault by shorting or grounding, a large current flows in the transmission line and the power distribution system is shut off in an electric power substation or the like, so that the power supply to the transmission line is interrupted. In such a case, it is necessary to immediately locate the faulty point to cope with the fault.

In this regard, various types of devices and systems have been devised and put into practice in order to locate such faulty points or sections of transmission lines.

In a technique for locating such a faulty point, a current detector is provided in each of a plurality of spots of a transmission line, to detect a difference between the arrival times of detected signals received from two spots, the location of which is known.

The principle of such a time difference detection method is briefly described with reference to FIG. 1A.

Referring to FIG. 1A, current detectors (CT) $2a$ to $2e$ are provided in a plurality of spots A, B, C, D and E of a transmission line 1, in order to detect the current flowing in the transmission line 1 at these spots. Further, time difference detection circuits $3a$ to $3d$ are arranged for detecting a difference between arrival times of signals received from a pair of neighboring current detectors. The time difference detection circuit $3a$ detects the difference between the arrival times of signals received from the current detectors $2a$ and $2b$, while the time difference detection circuit $3b$ detects the difference between the arrival times of signals received from the current detectors $2b$ and $2c$. The time difference detection circuit $3c$ detects the difference between the arrival times of signals received from the current detectors $2c$ and $2d$, while the time difference detection circuit $3d$ detects the difference between the arrival times of signals received from the current detectors $2d$ and $2e$. Each of these time difference detection circuits $3a$ to $3d$ includes a counter, for example, which is started to count when a fault current detection signal exceeding a prescribed level is received from one of the pair of current detectors, and stops its counting when another fault current detection signal exceeding the prescribed level is received from the other current detector.

For convenience of illustration, it is assumed that the transmission line 1 is divided into sections at regular intervals l by the spots A to E in the structure shown in FIG. 1A. It is further assumed that the time difference detection circuits $3a$ to $3d$ are provided at the central points of the respective sections. The operation of this structure will now be described. It is assumed that a spot P between the spots B and C develops a fault. At this time, a large surge current flows toward the spots B and C due to the fault. It is assumed that the length of a section BP is $l1$, the length of a section PC is $l2$ and the surge current flows at a velocity $V_S$, while each current detector transmits a signal to each time difference detection circuit through an optical fiber cable at a velocity $V_0$.

At this time, the leftward flow of the surge current requires the following time Tb to arrive at the spot B:

$$Tb = l1/V_S$$

Similarly, the rightward flow of the surge current requires the following time Tc to arrive at the spot C:

$$Tc = l2/V_S$$

Similarly, the surge or fault current requires the following times Ta, Td and Te to arrive at the spots A, D and E:

$$Ta = (l/V_S) + Tb$$

$$Td = (l/V_S) + Tc$$

$$Te = (2l/V_S) + Tc$$

Since the distances between the respective current detectors and the respective time difference detection circuits are equal to each other and the signals are transmitted through the optical fiber cables at the same velocity, time differences detected by the time difference detection circuits $3a$ to $3d$ are expressed as follows:

$$Da = Ta - Tb = l/V_S$$

$$Db = Tb - Tc = (l1 - l2)V_S$$

$$Dc = Tc - Tb = (l/V_S)$$

$$Dd = Td - Te = l/V_S$$

where Da to Dd represent the time differences detected by the time difference detection circuits $3a$ to $3d$ respectively.

As understood from the above equations, the time difference Db detected by the time difference detection circuit $3b$ differs substantially from those detected by the remaining time difference detection circuits $3a$, $3c$ and $3d$. Thus, it is possible to detect that the faulty section is between the spots B and C by observing the distribution of these time differences, while the faulty point itself can be located by observing the values of the time differences.

FIG. 1B is another block diagram showing the structure of the system using a time difference detection method. Each discriminator 12 includes four counters 201 to 204. The first counter 201 receives a surge signal from a current transformer CT1 to start counting and stops the counting by a stop signal from the second counter 202, which has received a surge signal from a current transformer CT2. Similarly, the second counter 202 receives the surge signal from the current transformer CT2 to start counting and stops the counting by a stop signal from the third counter 203, which has received a surge signal from a current transformer CT3 through a combining filter 205 and a branching filter 206.

When the surge signals from the current transformers are increased, it is possible to detect surges among a large number of spots by increasing the number of the counters.

The time differences detected by the counters 201 to 204 or the count values thereof are transmitted to the central unit 22 by a data transmission unit 207, and stored in a disk unit 213 through an O-E converter 21 and a personal computer 212. The personal computer 212 computes a surging spot, which in turn is displayed on a CRT 214 and printed out by a printer 215.

While each discriminator handles four current transformers in this example, it is possible to increase the number of such current transformers handled by each discriminator through a combining or branching filter. Alternatively, each discriminator may handle a minimum unit which includes two current transformers.

As another method of similarly using a surge current, it may be considered to detect a transmission line section where the surge current changes direction through surge phases which indicate that this section has developed a fault, thereby to locate the faulty section.

FIG. 3 is a perspective view showing a conventional faulty section locating system using the current resulting from a fault.

In the system shown in FIG. 3, a plurality of detectors are distributed along the transmission line. Data obtained by the detectors are collected for every prescribed line section by transmission means, such as an optical fiber cable or the like. The collected data are compared with each other for making decisions, and the results of comparison and/or decision are transmitted to a central unit or the like, for a synthetic evaluation.

Referring to FIG. 3, a transmission line 1 is strung along steel towers 10, which are installed at appropriate intervals. An optical fiber composite overhead ground wire (OPGW) 13 is mounted on upper parts of the steel towers 10 along the transmission line 1. Detectors 11 such as current transformers (CT) are mounted on the optical fiber composite overhead ground wire 13 at prescribed intervals. Further, discriminators 12 are mounted on prescribed ones of the steel towers 10 in order to receive detection signals from the detectors 11. Optical fiber cables 14 are connected between the detectors 11 and the discriminators 12. The discriminators 12 are connected to a central unit 22 by an optical fiber cable 17 provided in the optical fiber composite overhead ground wire 13. The discriminators 12 also serve as terminals for the data transmission.

The above mentioned conventional method is adapted to detect phases of a dynamic current flowing when a fault occurs thereby to locate a faulty section through changes of such phases and/or current levels.

However, the aforementioned conventional methods have the following problems:

(1) In the time difference detection method shown in FIG. 1, it is decided that a fault has occurred in a section having a time difference between signal arrival times which is different from those in other sections. Therefore, if a current detector becomes inoperable due to any cause, no time difference can be detected in a seciton adjacent to the inoperable current detector. Thus, it may be impossible to correctly locate a faulty section.

(2) When phase changes, levels, etc. of surge currents are detected to locate a faulty section, it is necessary to detect different phases or amplitudes of the surge current at the same time instant. In this case, however, it may be impossible to detect the current at the same time instant due to differences in response times caused by dispersion of the characteristics of the current detectors and due to differences of delay times following a signal propagation.

If the phases of a surge current flowing in a plurality of spots of a transmission line can be detected at the same time instant as shown in FIG. 2A, the distribution of the current phases can be correctly detected along the transmission line, thereby to locate the faulty section. However, when the surge current phases are detected at different time instants in the respective detection spots as shown in FIG. 2B, it is impossible to correctly detect the phases. Consequently, the phase distribution of a fault current thus obtained differs from the true phase distribution, whereby a correct detection of the fault current is impaired.

(3) In the method of detecting a dynamic current, the faulty section and spot are located only if a fault taking place in the transmission line, generates a dynamic current in response to such a fault. Otherwise, it is generally decided that a noise has occurred requiring a resetting of the respective detectors from a central monitoring station.

In a general overhead transmission line, however, it is not unusual that no fault current flows in the transmission line even if an overhead ground wire provided for protecting the overhead transmission line against a lightning stroke, has in fact been struck. In a recent monitoring system for an overhead transmission line, on the other hand, monitoring data from monitoring spots for the transmission line are transmitted through an optical fiber cable which is combined with the overhead ground wire.

When such an optical fiber composite overhead ground wire is struck by lightning, the optical fiber cable serving as a communication line, may be damaged which hinders the transmission of the monitoring data. Consequently, it may be impossible to correctly transmit the monitoring data of the transmission line to a central monitoring station, for example.

The conventional monitoring system has no structure for detecting only such a phenomenon when a line and its data transmission line have been struck by lightning. When a communication failure is caused by lightning, therefore, maintenance engineers of the power company must patrol along the entire transmission line to detect a spot struck by lightning. Thus, much labor and man-hours are required to find and repair the damage.

(4) In the conventional structure, a faulty section is detected by patrol after the occurrence of a fault with no relation to the presence or absence of a ground discharge or the like, to cope with the fault. In such case, a damaged portion of an optical fiber composite overhead ground wire may be unexpectedly detected. If an optical fiber composite overhead ground wire which has been struck by lightning does not develop any fault, any damage of the overhead ground wire caused by the lightning can be detected only by a routine inspection by patrollers. If no damaged portion is found through such routine inspection by the patrollers, the damage of the optical fiber composite overhead ground wire is completely overlooked. Therefore, it is desirable to provide an apparatus and a system which can detect a spot of an optical fiber composite overhead ground wire that has been struck by lightning, for finding a damaged portion of the optical fiber composite overhead ground wire for preventing the occurrence of a communication failure or the like even if the lightning does not cause any fault.

(5) In the system shown in FIG. 3A, it is necessary to install a plurality of detectors along the transmission line, since a transmission path is required for transmitting data obtained by these detectors. Such detectors must be installed after the transmission line is laid. Further, it is necessary to cut an optical fiber cable in portions provided with the detectors, in order to transmit the data from the respective detectors to other spots. Thus, the conventional system is complicated in structure and requires a troublesome operation for installing the system, while the system price is increased.

SUMMARY OF THE INVENTION

It is an object of the present invention to provide an apparatus and a system for locating a point struck by lightning and a faulty point of a transmission line, which can compensate for a malfunction of a detector to reliably locate the faulty point and section, and which can locate each lightning struck spot and section even if the lightning does not cause any fault.

Another object of the present invention is to provide a system for locating a point struck by lightning which is simple in its structure, easy to install and reduced in cost.

An apparatus according to the present invention comprises a plurality of current detectors, a time difference detector and a phase difference detector. The current detectors are distributed in a plurality of prescribed spots along a transmission line for detecting a current flowing in these spots of the transmission line. The time difference detector receives detection signals from those of the current detectors located in two arbitrary spots within the plurality of prescribed spots, to detect a difference between the arrival times of the detected signals. The phase difference detector receives the detection signals from those of the current detectors provided in the two spots and extracts low-frequency components of a predetermined frequency domain from the detected signals, to detect a phase difference between the extracted low-frequency components.

A lightning struck or faulty point and section locating system according to another aspect of the present invention comprises a plurality of the aforementioned locating apparatuses arranged in a transmission line, and a locating unit. The locating unit receives data detected by the respective lightning struck or faulty point and section locating apparatuses, to detect or locate the struck spot and section of the transmission line on the basis of the detected data.

A faulty point and section locating apparatus according to still another aspect of the present invention comprises a plurality of current detectors, a time difference detector and a phase difference/amplitude difference detector. The plurality of current detectors are provided in a plurality of prescribed spots along the transmission line for detecting a current flowing in the plurality of prescribed spots of the transmission line. The time difference detector receives detection signals from those of the current detectors provided in two arbitrary spots within the plurality of prescribed spots, to detect a difference between the arrival times of the detected signals. The phase difference/amplitude difference detector receives the detection signals from the current detectors provided in the two arbitrary spots, to detect a phase difference and/or an amplitude difference between the detected signals.

Further, a time difference detector and/or a phase difference/amplitude difference detector detects time differences and/or phase differences in respective ones of a first section and a second section including the first section.

The aforementioned current detector detects a current flowing in an overhead ground wire and/or power line extended along the transmission line.

In the aforementioned structure, the time difference detector operates in response to surge current components, which are changed at high speeds, of the current flowing in the transmission line, to output time difference data. The phase difference detector or phase difference/amplitude difference detector outputs data of phase differences. On the basis of outputs from these two detectors, a faulty or thunderstruck section and spot are located. Therefore, even if an error is caused in one of the outputs from the detectors, such an error can be compensated for by the outputs from the other detectors. Thus, the fault locating accuracy of a monitoring system has been improved by the invention. Specifically, the locating accuracy has been improved by combining detection signals from a section between two arbitrary spots and those from another section including the first mentioned section.

The phase difference detector has a low frequency extracting function for extracting loosely changed low-frequency components included in surge current to detect a phase difference between the low-frequency components, thereby to compensate for an error caused by a difference between response speeds of the current detectors and to derive correct phase difference detection data. Thus, the faulty or lightning struck point and section can be correctly located. The lightning struck point will simply be referred to as the struck point hereafter.

A struck point locating system according to a further aspect of the present invention comprises an optical fiber cable arranged along a transmission line, a light source for emitting light transmitted in the optical fiber cable and a struck point detector, which measures the intensity distribution of the light transmitted in the optical fiber cable to detect a temperature distribution along the optical fiber cable, thereby to detect the struck point on the basis of the detected temperature distribution.

When the transmission line is struck by lightning a large surge current instantaneously flows in the struck point, to cause a temperature rise by Joule heat. The intensity distribution of the light transmitted in the optical fiber cable is changed by such temperature rise. The aforementioned struck point locating system detects this temperature distribution of the optical fiber cable by measuring the intensity distribution of the light, whereby the struck point can be located on the basis of the detected temperature distribution.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1A:
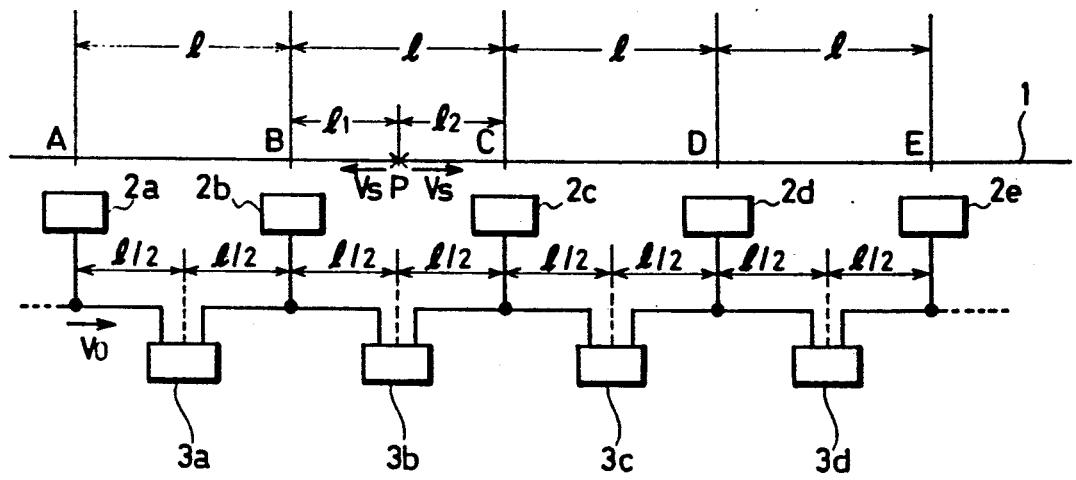
FIG. 1A is a diagram for illustrating the principle of a conventional transmission line monitoring system according to a time difference detection method.
Figure 2A:
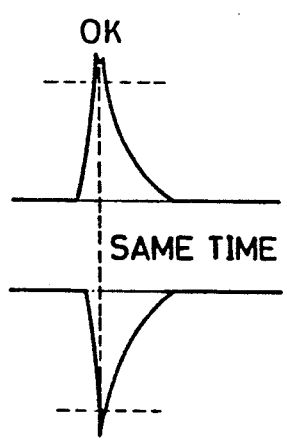
FIGS. 2A and 2B are diagrams for illustrating a problem encountered in a conventional surge current phase detection method.
Figure 2B:
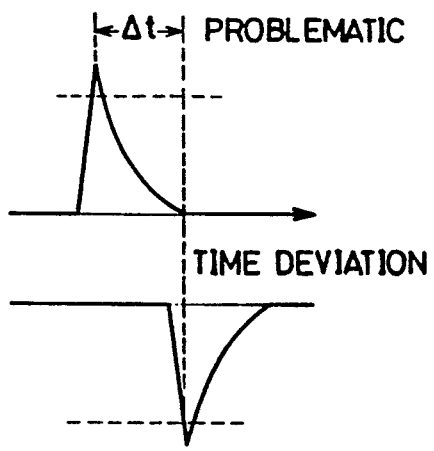
Figure 1B:
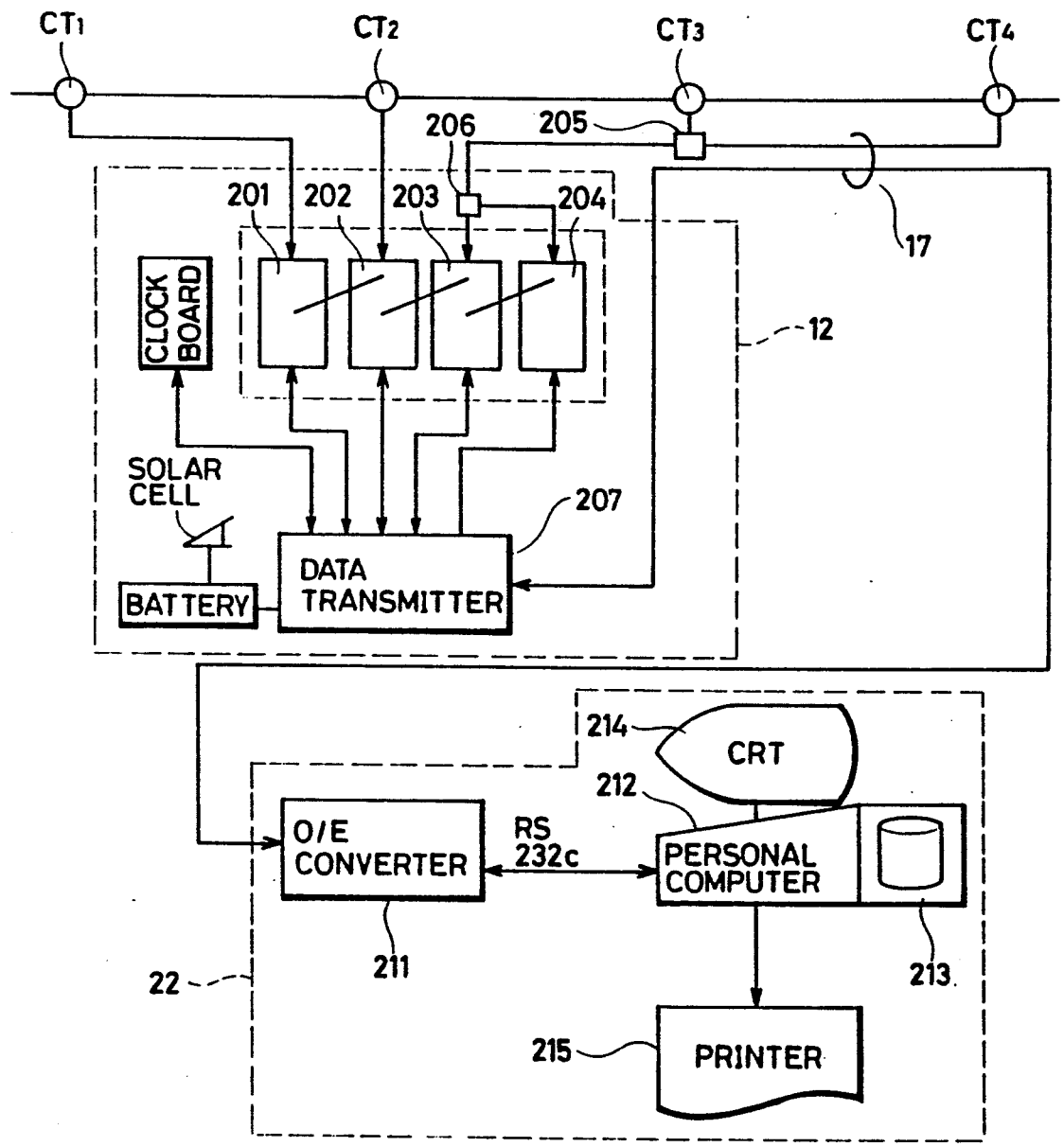
FIG. 1B is a block diagram showing the structure of another system also operating according to a time difference detection method.
Figure 3:
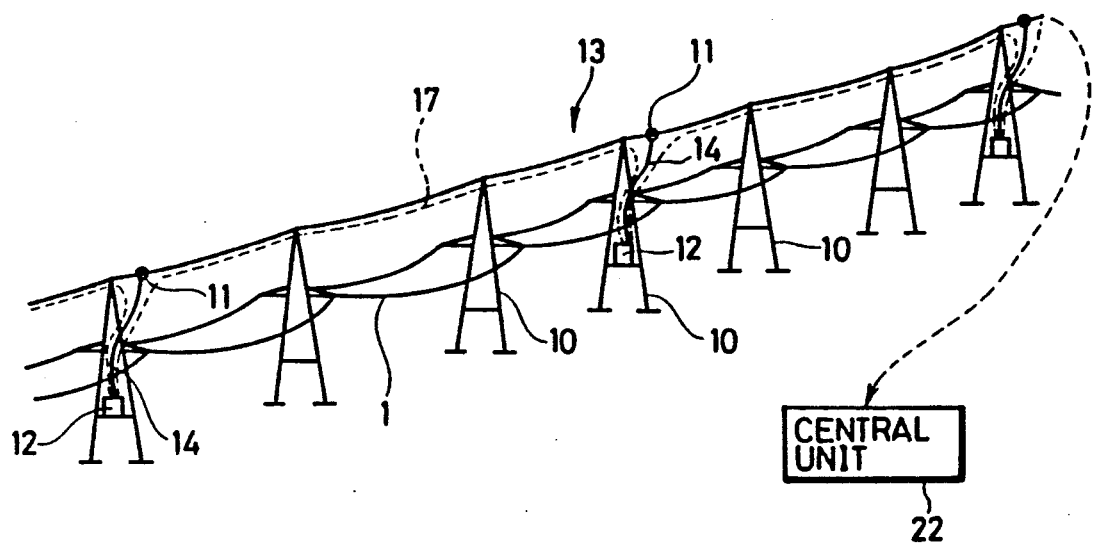
FIG. 3 is a perspective view showing the structure of a conventional faulty section locating system.
Figure 4:
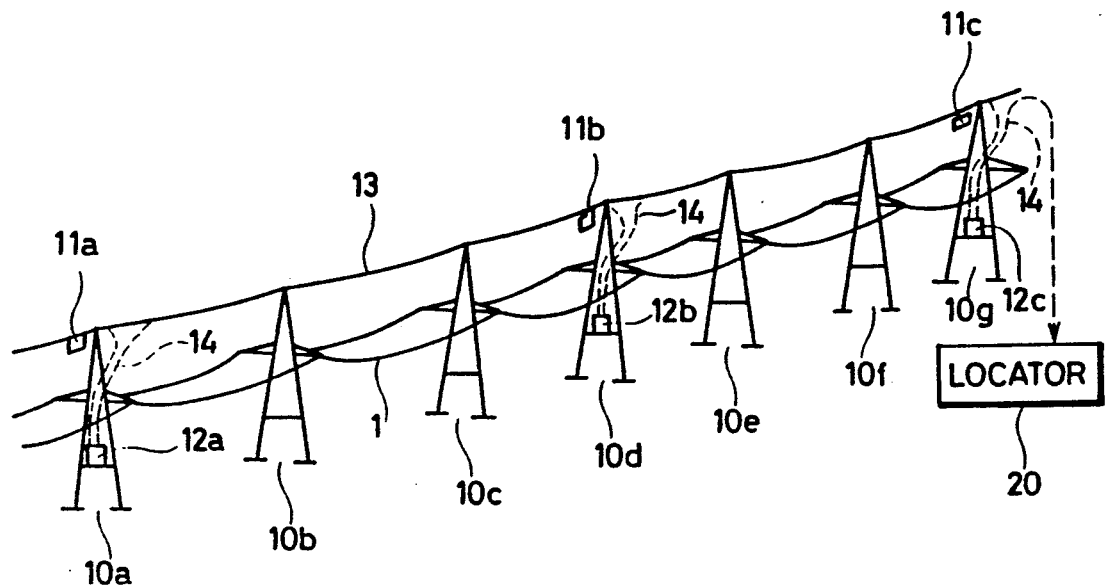
FIG. 4 illustrates one example installation mode of a struck and faulty section/spot locating system according to an embodiment of the present invention.

Referring to FIG. 4, an overhead transmission line 1 is suspended and supported by steel towers 10a to 10g. An overhead ground wire 13 extends above the transmission line 1 in order to prevent lightning from striking the power line. The ground wire is suspended on top portions of the steel towers 10a to 10g. Current detectors 11a, 11b and 11c are provided in the vicinity of the steel towers 10a, 10d and 10g respectively for detecting a current flowing in the overhead ground wire 13. Outputs of the current detectors 11a to 11c are connected to connection boxes 12a, 12b and 12c, which are provided in the corresponding steel towers 10a, 10d and 10g. The connection or junction boxes 12a to 12c are each provided with a discriminator.

Figure 5:
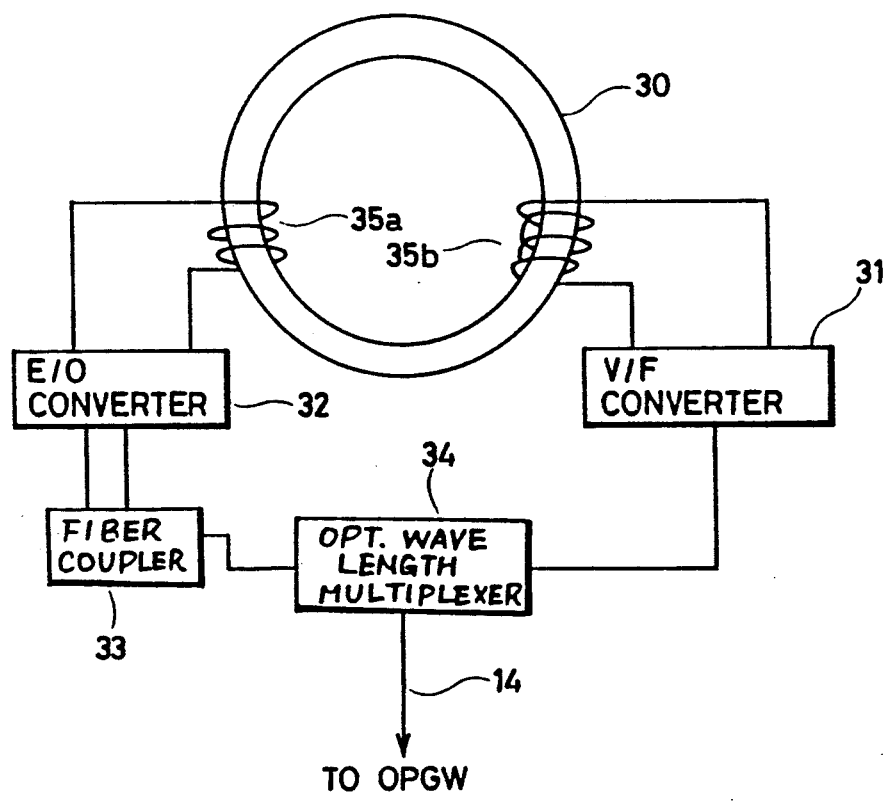
FIG. 5 illustrates an example of a current detector employed in the embodiment of the present invention.

Each of the connection or junction boxes 12a to 12c receives current data from those of the current detectors 11a to 11c provided in two spots and detects differences between the arrival times and phases of signals received from the two spots, to transmit these differences to an adjacent connection box through an optical fiber cable 14. Information from the connection or junction box 12c is supplied to a locator 20, which is provided in a central monitoring station, for example, through the optical fiber cable 14. The locator 20 locates a struck point or section in the overhead ground wire 13 on the basis of time difference data and phase difference data received from the connection or junction boxes 12a to 12c. The optical fiber cable 14 is combined into the overhead ground wire 13. The following description is made on the assumption that the overhead ground wire 13 is an optical fiber composite overhead ground wire (OPGW). FIG. 5 illustrates the structure of each current detector.

Referring to FIG. 5, a current detector (CT) 11 for detecting the current flowing in the overhead ground wire 13 comprises a core 30 for detecting a magnetic field induced by the current flowing in the overhead ground wire 13. Coils 35a and 35b derive current responsive to the magnetic field induced by the core 30. An electrical-to-optical converter (E-O converter) 32 converts a secondary current output from the coil 35a to an optical signal. This E-O converter 32 has a positive-phase output and a negative-phase output, which are derived through different paths respectively. A fiber coupler 33 receives and superposes two optical signals outputted from the E-O converter 32 respectively, and supplies the same to an optical wavelength multiplexer 34.

A voltage-to-frequency converter (V-F converter) 31 converts a secondary current output from the coil 35b to a voltage signal, and further converts the converted voltage signal to a corresponding frequency signal. In other words, the V-F converter 31 converts the secondary current signal derived from the coil 35b to an optical pulse train signal and outputs the same. The optical wavelength multiplexer 34 receives the optical signals from the fiber coupler 33 and the V-F converter 31, to combine the same with each other. The output from the optical wavelength multiplexer 34 is transferred to the optical fiber composite overhead ground wire 13 through the optical fiber cable 14.

The V-F converter 31 is set at a modulation frequency of not more than several KHz, so that the same can extract and output only a low-frequency component of a signal such as a surge current signal which is changed at a high speed. On the other hand, the output from the E-O converter 32 is not subjected to any frequency conversion, and hence a signal such as a lightning surge or switching surge corresponding to change in the current flowing in the overhead ground wire 13 is directly derived.

Current detectors provided for each one or more steel towers may be divided into groups so that one signal processor or rather signal discriminator is provided for the current detectors or sensors of each group.

Figure 6:
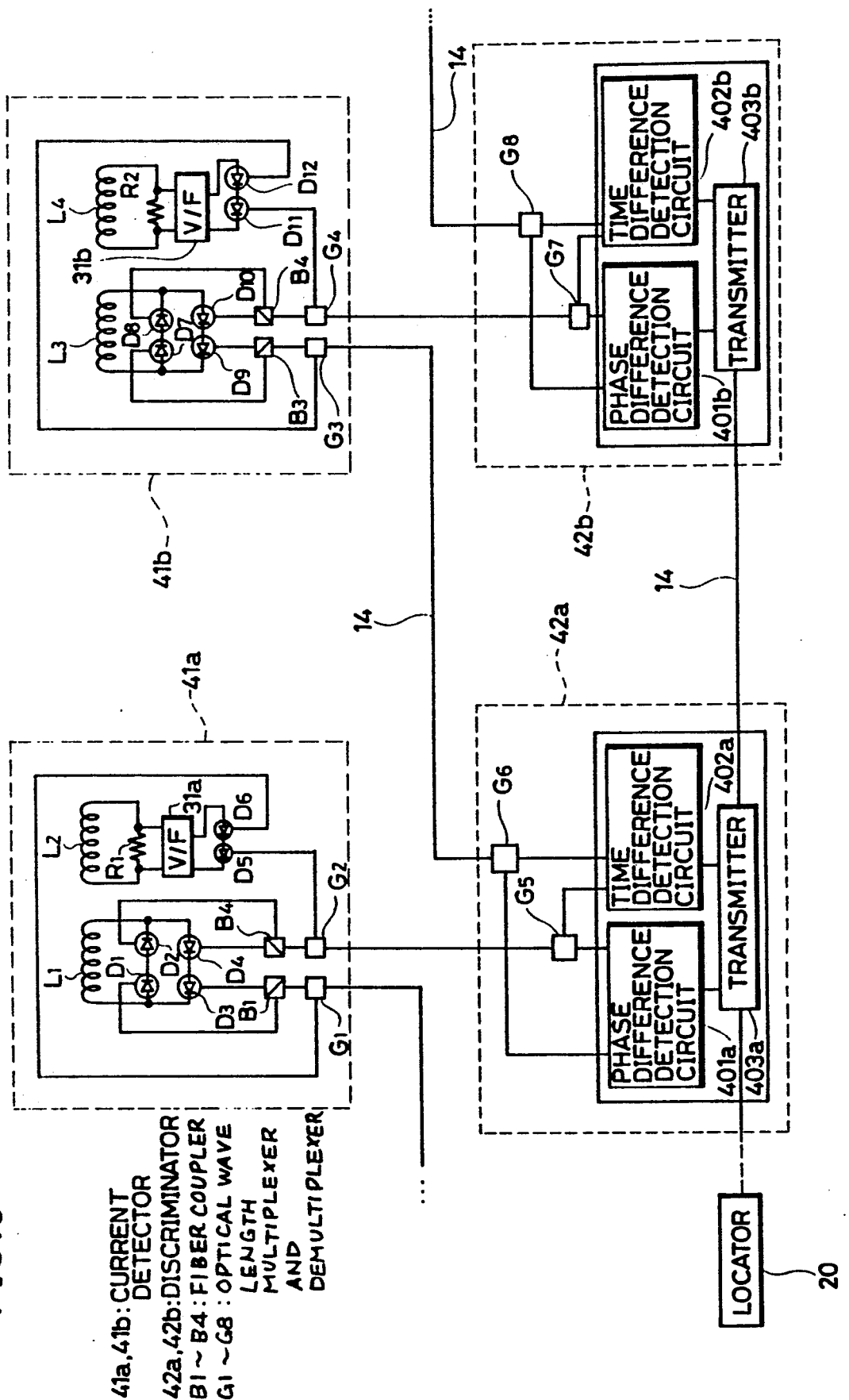
FIG. 6 illustrates the structure of a principle part of this embodiment in detail.

FIG. 6 illustrates the structure of a principal part of the struck and faulty section/spot locating system according to this embodiment. This figure schematically shows a part which is formed by two current detectors and two discriminators at local stations.

Referring to FIG. 6, current detectors 41a and 41b for detecting the current flowing in the overhead ground wire, not shown, are identical in structure to each other. The structure of the current detectors shown in FIG. 6 corresponds to that of FIG. 5.

The current detector 41a has coils L1 and L2, which derive a secondary current corresponding to a magnetic field induced by the CT core, not shown, for detecting the current flowing in the overhead ground wire. The coil L1 derives a signal which is changed at a high speed such as a lightning surge or switching surge, which may occur in a power transmission/distribution system in a substation or the like. The coil L2 derives a low-frequency component included in the surge current. The secondary current derived by the coil L1 is converted to optical signals by electrical-to-optical converters such as light emitting diodes D1 and D2 and diodes D3 and D4. The light emitting diodes D1 and D2 and the diodes D3 and D4 are oppositely connected to derive a positive polarity current and a negative polarity current from the coil L1.

The optical signals derived by the light emitting diodes D1 and D3 are supplied to a fiber coupler B1 and are superposed with each other. The optical signals derived by the diodes D2 and D4 are supplied to another fiber coupler B2.

The secondary current derived by the coil L2 is converted to a voltage signal by a resistor R1 and thereafter supplied to a V-F converter 31a, to be converted to a low-frequency signal. The output from the V-F converter 31a is converted to optical signals by light emitting diodes D5 and D6. The output of the light emitting diode D5 is supplied to an optical wavelength multiplexer and demultiplexer G2, while that of the light emitting diode D6 is supplied to another optical wavelength multiplexer and demultiplexer G1.

The optical wavelength multiplexer and demultiplexer G2 combines a current detection signal from the fiber coupler B2 with that from the light emitting diode D5. The output from the optical wavelength multiplexer and demultiplexer G2 is supplied to a discriminator 42a, while that from the optical wavelength multiplexer and demultiplexer G1 is transmitted to another discriminator, which is provided at another spot.

The current detector 41b is similar in structure to the current detector 41a, and comprises a coil L3 for deriving a high-speed signal such as a surge current signal, light emitting diodes D7, D8, D9 and D10 for converting the output from the coil L3 to optical signals, a fiber coupler B3 for superposing the outputs from the light emitting diodes D7 and D9 with each other and another fiber coupler B4 for superposing the outputs from the light emitting diodes D8 and D10 with each other. In order to derive the low-frequency component included in the surge current, the current detector 41b further comprises a coil L4 for deriving the secondary current from the CT core, not shown, a resistor R2 for converting the output of the coil L4 to a voltage signal, a V-F converter 31b for converting the voltage signal converted by the resistor R2 to a signal of a corresponding frequency and light emitting diodes D11 and D12 for converting the output from the V-F converter 31b to optical signals.

The outputs of the fiber coupler B4 and the light emitting diode D11 are combined with each other by an optical wavelength multiplexer and demultiplexer G4, to be supplied to a discriminator 42b. The outputs of the fiber coupler B3 and the light emitting diode D12 are combined with each other by another optical wavelength multiplexer and demultiplexer G3, to be transmitted to another discriminator 42a which is provided in an adjacent spot through the optical fiber cable 14.

Each of the fiber couplers B1, B2, B3 and B4 merely superposes received optical signals with each other, while each of the optical wavelength multiplexer and demultiplexers G1, G2, G3 and G4 combines signals, which have different wavelengths, received from each fiber coupler and each light emitting diode with each other and outputs the same.

The discriminator 42a for deriving information for locating a struck point or section includes optical wavelength multiplexer and demultiplexers G5 and G6. The optical wavelength multiplexer and demultiplexer G6 receives the optical signal from the current detector 41b which is provided in an adjacent spot through the optical wavelength multiplexer and demultiplexer G3 and the optical fiber cable 14, branches and transfers the same to a phase difference detection circuit 401a and a time difference detection circuit 402a. The optical wavelength multiplexer and demultiplexer G5 receives a current detection signal from the current detector 41a and separates the same into high-frequency and low-frequency components to supply these components to the phase difference detection circuit 401a and the time difference detection circuit 402a respectively.

The phase difference detection circuit 401a detects the presence or absence of a phase difference between the low-frequency components of the surge current received from the optical wavelength multiplexer and demultiplexers G6 and G5. Further, the phase difference detection circuit 401a converts received optical signals to electrical signals and then compares levels and phases thereof with each other to decide that the transmission line has been struck by lightning and supply the result of the decision to a transmitter 403a when the levels of the received signals exceed a constant predetermined level and the phase difference between the received signals is within a prescribed range of 90° to 270°, for example.

The time difference detection circuit 402a is formed by a counter, for example. This time difference detection circuit 402a is started for counting when one of the signals received from the optical wavelength multiplexer and demultiplexers G5 and G6 exceeds a prescribed level, and stops its counting operation when the other signal is received, to output the counted value. Thus, the difference between arrival times of the surge current signals received from the current detectors 41a and 41b can be detected by observing the count value.

The output of the time difference detection circuit 402a is supplied to the transmitter 403a. This transmitter 403a superposingly or independently supplies a signal received from another transmitter 403b, which is provided in the discriminator 42b, through the optical fiber cable 14, the result of a decision as to presence or absence of a ground discharge in its own station and time difference information to the locator 20, which is provided in a central monitoring station, for example.

The discriminator 42b is similar in structure to the discriminator 42a, and comprises an optical wavelength multiplexer and demultiplexer G8 for separating an optical signal from a current detector provided in an adjacent spot, another optical wavelength multiplexer and demultiplexer G7 for branching the output from the corresponding current detector 41b, a phase difference detection circuit 401 for detecting a phase difference on the basis of outputs from the otpical wavelength multiplexer and demultiplexers G7 and G8, a time difference detection circuit 402b for detecting a difference between arrival times of signals, and the transmitter 403b for transmitting outputs of the phase difference detection circuit 401b and the time difference detection circuit 402b.

The phase difference detection circuits 401a and 401b re-convert frequency signals, which have been converted by the V-F converters 31a and 31b, through frequency-to-voltage converters, F-V converters, to detect the presence or absence of any phase differences. The V-F converters 31a and 31b, having low response speeds convert voltage signals to low frequency signals of 60 cycle/sec, for example, and output the same. Therefore, the phase difference detection circuits 401a and 401b determine the presence or of phase differences from said low frequency signals of about 60 Hz.

The operation of the system shown in FIG. 6 is now described.

When the overhead ground wire 13, see FIG. 4, is struck by lightning, a large surge current is developed in the overhead ground wire 13. This surge current changes the secondary current in the coils L1 to L4 included in the current detectors 41a and 41b. The outputs of the coils L1 and L3 are converted to optical signals by the light emitting diodes D1 to D4 and the light emitting diodes D7 to D10 respectively, to be transferred to the corresponding discriminators 42a and 42b by the fiber couplers B1 to B4.

On the other hand, a secondary surge current detected by the coils L2 and L4 is converted to voltage signals by the resistors R1 and R2 respectively, and the voltage signals are further converted by the V-F converters 31a and 31b to signals of frequencies corresponding to the voltage amplitudes. The V-F converters 31a and 31b eliminate any high-frequency components included in the high-speed lightning surge current, to derive only prescribed low-frequency components. Therefore, only the low-frequency components included in the high-frequency surge current are derived from the light emitting diodes D5 and D6 and the light emitting diodes D11 and D12.

The high-frequency components and the low-frequency components of the surge current are superposed on signals of different wavelengths respectively, and transmitted to corresponding discriminators through the optical wavelength multiplexer and demultiplexers G1 to G4.

The discriminator 42a receives signals from the current detectors 41a and 41b, to perform the following discriminating operation: The phase difference detection circuit 401a converts the low-frequency component signals received through the optical wavelength multiplexer and demultiplexers G5 and G6 to voltage or current signals through F-V converters or the like, to detect the presence or absence of a phase difference therebetween. When the received signals exceed a prescribed level and the phase difference therebetween is at least a prescribed value, the phase difference detector 401a decides that the phase difference is present and a surge current has been generated in this section, to supply the phase difference information to the transmitter 403a.

On the other hand, the time difference detection circuit 402a receives the high-frequency component signals from the optical wavelength multiplexer and demultiplexers G5 and G6. The time difference detection circuit 402a converts the level of a previously received signal to an electrical signal. Then, if the level exceeds a prescribed value, the counter is first started for counter operation. This counter operation is stopped when a signal received from one of the current detectors exceeds a prescribed value. Thus, a count value corresponding to the difference between arrival times of the signals can be derived. This count value information is supplied to the transmitter 403a.

The discriminator 42b performs a similar operation, to supply detected information from the transmitter 403b to the transmitter 403a through the optical fiber cable 14.

The transmitter 403a supplies the detected information from the corresponding discriminator 42a and that from the adjacent discriminator 42b, to the locator 20 which is provided in the central monitoring station. The locator 20 detects the faulty or struck spot from the phase difference data and time difference data thus supplied. In other words, the locator 20 receives the detection data from the discriminators 42a and 42b and synthesizes the distribution of the detected data along the transmission line, thereby to detect the struck spot and section.

When it is determined that some large current is generated by change caused in detection data from each discriminator, the locator 20 makes a display in accordance with information indicating the presence or absence of tripping or shut-off of a power transmission or distribution system in a substation, for example.

Tripping or shut-off is caused in response to a large current. Thus, the occurrence of such tripping or shut-off indicates that a lightning has caused a fault. In that case, the locator 20 displays the presence of the fault. On the other hand, an absence of a tripping indicates that the transmission line has been struck by lightning without causing a fault. In such a case, the locator 20 displays the fact that a fault has not been caused by the strike of lightning.

In the aforementioned embodiment, the transmitters transmit only the data representing the presence or absence of phase differences and time difference data to the locator 20. However, such transmitters may be so formed as to detect whether or not a dynamic current signal having a stable frequency of 60 Hz, for example, and a large current level following surge current, has been generated after the detection of phase and time differences and to transmit data indicating the presence or absence of the dynamic current to the locator 20 in the central monitoring station. The presence or absence of a ground fault can be detected also in this case. In other words, no dynamic current is generated if the transmission line is merely struck by lightning without causing a fault. Thus, it is possible to determine whether or not the transmission line is merely struck by lightning through the presence or absence of the dynamic current.

Further, although no specific structure of each phase difference detection circuit is described above, the phase difference detection circuit may be formed to merely observe a deviation of a zero crossover between two given signal waveforms. For example, a zero crossover detector is provided in each signal input part, to AND the output of this zero crossover detector. Such a zero crossover detector can be simply formed by an operational amplifier. The presence and absence of a phase difference between the signals and the level of the phase difference can be easily detected by observing the pulse width of an output from an AND gate.

In the aforementioned embodiment, the V-F converters are employed for deriving the low-frequency signals. However, such V-F converters may be replaced by low-frequency filters, which can be easily formed by CR filters using resistors R and capacitors C, active filters using operational amplifiers or the like.

When the result of locating the struck spot made by time difference discrimination, matches with that made by phase difference discrimination in the above embodiment, the results are displayed to indicate the finding of the struck spot or section and the presence or absence of the phenomenon caused by the strike of lightning. It means that said finding or decision has been confirmed by two methods, whereby the reliability of the locating operation has been improved.

In the aforementioned embodiment, the signal phase differences are detected only through the low-frequency components, which are changed at low speeds, in the surge current which is changed at a high speed. In order to directly process the surge current to detect phase differences, a high response speed is required for a processing circuit for such an operation. Thus, the processing circuit may be complicated in its circuit structure, whereby the power consumption may be increased.

When decisions are made only through the low-frequency components as hereinabove described, on the other hand, it is possible to compensate for an error which may be caused by a deviation in the response ability of the outputs of the current detectors thereby to correctly detect phase differences, since the signals are changed at low speeds. Further, a processing circuit for processing such low-frequency components, can be formed by a low-speed circuit, thereby to reduce the power consumption.

In spots where high-level power sources can be easily employed, however, a high-speed surge current may be simply used without using low-frequency components, to detect phases of the surge current derived by respective current detectors and/or current levels, e.g. amplitudes thereof, thereby to derive only these data. In other words, phase data and/or level data may be simply derived without comparing outputs of current detectors from two spots with each other.

In this case, time difference detection circuits detect differences between arrival times of signals similarly to the above embodiment, to transmit the time difference data to a locator which is provided in a central monitoring station, so that one phenomenon is observed and monitored by devices having independent judging or determination functions. Therefore, even if one measuring device causes a malfunction, other devices can compensate for such a malfunction. Thus, it is possible to prevent a malfunction of the overall system, thereby to obtain a highly reliable system.

Figure 7:
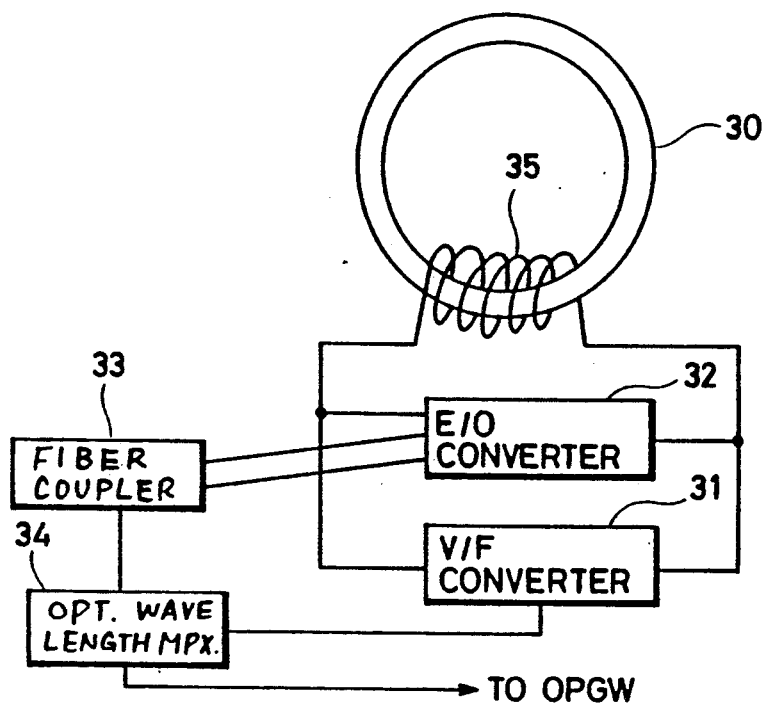
FIG. 7 illustrates another example of a current detector employed in this embodiment.

FIG. 7 illustrates another exmaple of the current detector.

The current detector shown in FIG. 5 derives signals from different systems through two coils which are wound on the CT core. On the other hand, only one coil 35 is wound on a CT core 30 in the current detector shown in FIG. 7, so that the output of the coil 35 is commonly applied to an E-O converter 32 and a V-F converter 31. An effect similar to that of the current detector shown in FIG. 5, can be obtained also in this case.

In the structure shown in FIG. 7, the V-F converter 31 converts a received electrical signal to an optical signal, and supplies the optical signal to an optical wavelength multiplexer 34. Similarly, a fiber coupler 33 superposes high-speed bipolar analog signals received from the E-O converter 32, with each other to output the same. The optical wavelength multiplexer 34 superposes outputs of different wavelengths from the E-O converter 32 and the V-F converter 31 with each other to derive the same in a corresponding discriminator through an optical fiber cable included in an optical fiber composite overhead ground wire.

Figure 8:
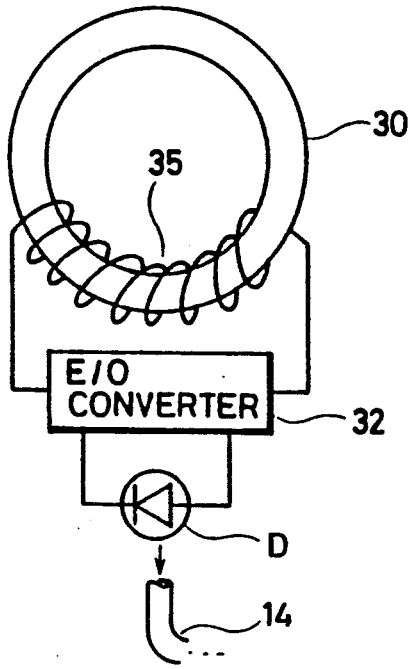
FIG. 8 illustrates still another example of a current detector employed in this embodiment.

FIG. 8 illustrates still another example of the current detector having a secondary current coil 35 which is wound on a CT core 30. The secondary current is converted to a high-speed optical signal by an E-O converter 32 and a light emitting diode D, which supplies its signal to an optical fiber cable 14.

In this case, the current detector derives only a signal corresponding to a high-speed surge current. Therefore, a discriminator is used as shown in FIG. 9.

Figure 9:
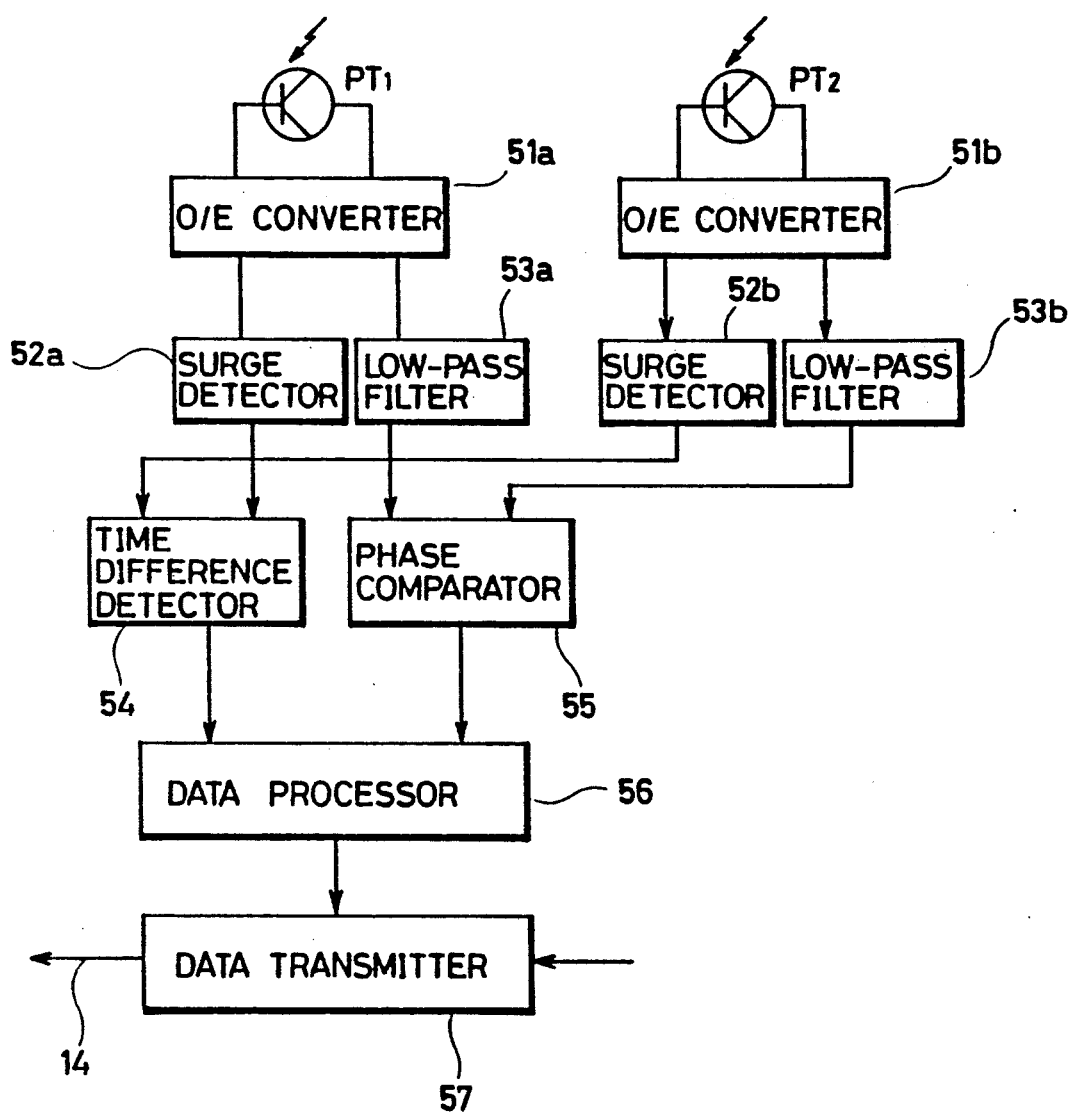
FIG. 9 schematically illustrates an example of a discriminator used in this embodiment when the current detector of the structure shown in FIG. 8 is employed.

Acccording to the structure shown in FIG. 9, the discriminator separates the signal from the current detector into a surge signal and a low-frequency signal, to detect time and phase differences respectively.

The discriminator shown in FIG. 9 is provided with optical-to-electrical converters (O-E converters) 51a and 51b, which include photo transistors PT1 and PT2 for converting optical signals received from two spots, to electrical signals respectively. The O-E converters 51a and 51b receive outputs from current detectors which are provided in different spots respectively. The output of the O-E converter 51a is separated and supplied into two circuits. One circuit includes a surge detector 52a and the other circuit includes a low-pass filter 53a, respectively.

The surge detector 52a receives a surge current when the level of the signal from the O-E converter 51a exceeds a prescribed value, to output a corresponding signal at this time. The low-pass filter 53a passes only a frequency component having a frequency close to a prescribed frequency of 60 or 50 Hz, for example, of the output signal from the O-E converter 51a, for example.

Similarly, another surge detector 52b and another low-pass filter 53b output a surge detection signal and a prescribed low-frequency component, respectively.

A time difference detector 54 receives the output signals from the surge detectors 52a and 52b, to start a counting operation in response to a first received surge detection signal and to stop the counting operation in response to a second received surge detection signal. Thus, the difference between the arrival times of the surge current signals received from two spots can be detected.

A phase comparator 55 receives the outputs from the low-pass filters 53a and 53b, to compare the phases thereof with each other and to decide whether a phase difference is present or absent. This phase comparator 55 detects a deviation in a zero crossover of the signals received from the two low-pass filters 53a and 53b to decide the presence or absence of a phase difference, for example, or simply performs an AND operation for the two signals to decide the presence or absence of a phase difference on the basis of the pulse width of the AND output.

The outputs of the time difference detector 54 and the phase comparator 55 are supplied to a data processor 56. The data processor 56 performs a programmed or prescribed processing on the supplied signals respectively, to derive a time difference information and an information indicating the presence or absence of a phase difference in the signals from the comparator 55. The time difference information may be used as a counted value information itself, or it may be converted to a time information.

The output of the data processor 56 is supplied to a data transmitter 57. The data transmitter 57 supplies the information received from the data processor 56 to a locator which is provided in a central monitoring station, through an optical fiber cable 14. As to the mode of information outputted by the data transmitter 57, wavelengths assigned in correspondence to respective discriminators may be multiplexed for transmission, for example, by frequency-multiplexing, or by simple time-division multiplexing by a polling system.

Figure 10:
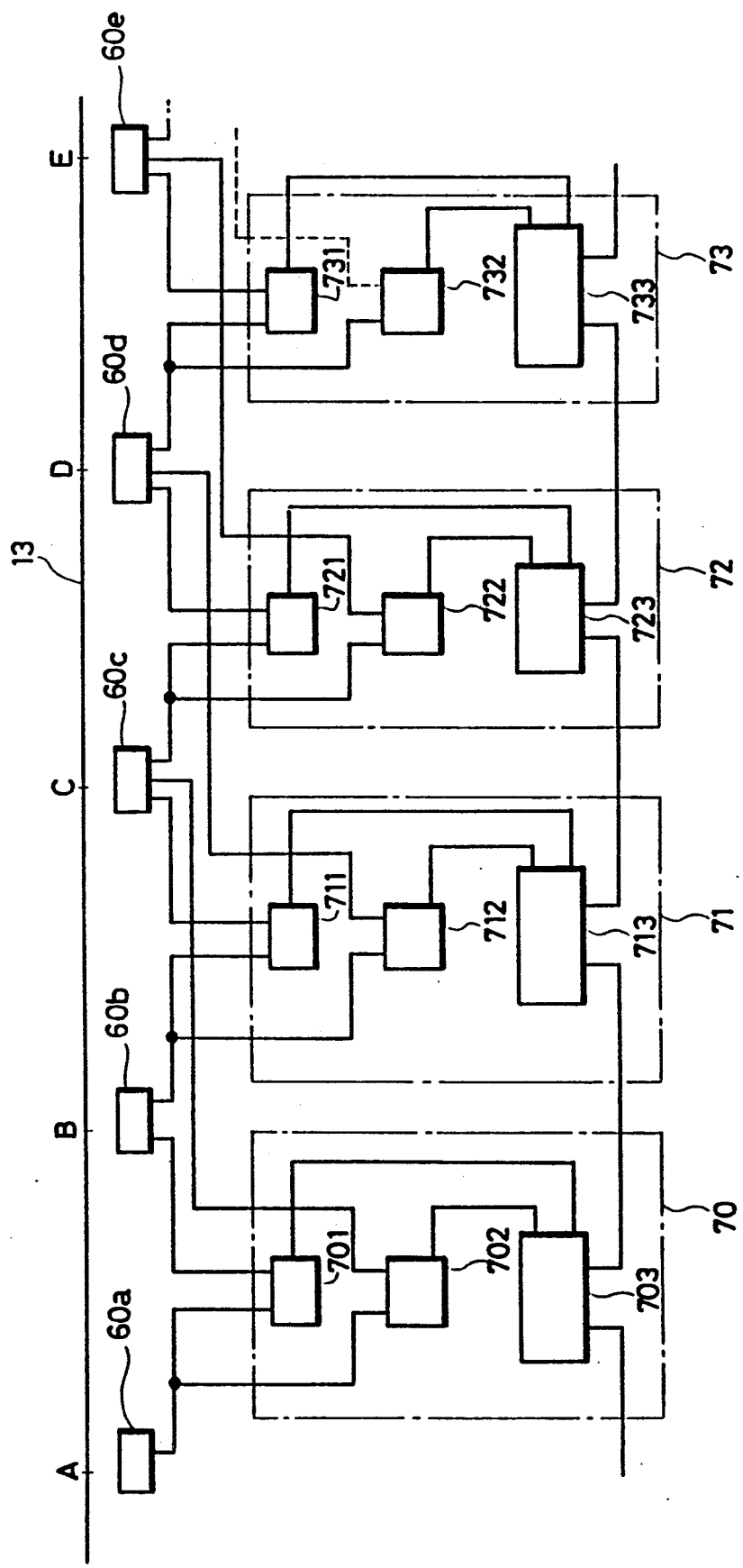
FIG. 10 illustrates a struck and faulty section/spot locating system according to another embodiment of the present invention.

FIG. 10 is a block diagram showing the structure of a struck and faulty section or spot locating system according to another embodiment of the present invention.

Referring to FIG. 10, the locating is performed in a transmission line through a plurality of current detection signals in a section between two given spots and a section including the two spots. In other words, this embodiment includes a system structure for improving locating accuracy by combining detection data of said line sections.

Referring to FIG. 10, current detectors 60a, 60b, 60c, 60d and 60e are provided in predetermined spots A, B, C, D and E of a transmission line 13. Further, local stations 70, 71, 72 and 73 are provided corresponding in number to the number of the current detectors.

The local station 70 includes a discriminator 701 for receiving outputs from the current detectors 60a and 60b, another discriminator 702 for receiving outputs from the current detectors 60a and 60c, and a transmission terminal 703 for transferring discrimination data from the discriminators 701 and 702 to a locator which is provided in a central monitoring station, for example.

The local station 71 includes a discriminator 711 for receiving outputs from the current detectors 60b and 60c, another discriminator 712 for receiving outputs from the current detectors 60b and 60d, and a transmission terminal 713 for transferring discrimination data from the discriminators 711 and 712 to the locator provided in the central monitoring station, for example.

The local station 72 includes a discriminator 721 for receiving outputs from the current detectors 60c and 60d, another discriminator 622 for receiving outputs from the current detectors 60c and 60e, and a transmission terminal 723 for receiving outputs from the discriminators 721 and 722. The local station 73 includes a discriminator 731 for receiving outputs from the current detectors 60d and 60e, another discriminator 732 for receiving outputs from the current detector 60d and another discriminator not shown, and a transmission terminal 733 for receiving outputs from the discriminators 731 and 732.

Each of the discriminators 701, 702, 711, 712, 721, 722, 731 and 732 detects a time difference and/or a phase difference and/or an amplitude difference in the section provided with the corresponding current detectors. In this case, each discriminator may extract prescribed low-frequency components from the outputs of the corresponding current detectors to detect the phase difference, etc. between the low-frequency components.

According to the above structure, the local station 70 monitors the current in a section A-B and a section A-C including the section A-B. Similarly, the local station 71 monitors the current in sections B-C and B-D. The local station 72 monitors sections C-D and C-E, and the local station 73 monitors a section D-E and a section including the section D-E.

As hereinabove described, current data in a section between given spots and a section including said section are monitored to combine the data detected in these sections, thereby to locate a faulty section or struck point in the transmission line. Thus, the locating accuracy can be further improved.

In the aforementioned embodiment the local stations 70, 71, 72 and 73 have the transmission terminals 703, 713, 723 and 733 respectively. Alternatively, the local stations 70 to 73 can define one local station, to attain an effect similar to that of the above embodiment. Also, when one local station monitors a plurality of overlapping sections such as the sections A-B, A-C, A-D, A-E, B-C, B-D and B-E, for example, it is possible to attain an effect similar to that of the above embodiment.

Although each local station monitors only two arbitrarily selected sections in the above embodiment, the same may monitor a larger number of sections. An effect similar to that of the above embodiment can be attained also in the case where more than two sections are monitored.

While no particular description has been made as to the structure of the optical fiber cable for transferring the data from the current detectors to the discriminators in relation to the above embodiment, the optical fiber cable may be appropriately made to include a single-conductor or a multi-conductor cable may be used and the structure of the cable will depend on the installation conditions.

While the above embodiment is adapted to detect the current flowing in the overhead ground wire, it is also possible to detect current flowing in a power line forming part of a transmission line system, to attain an effect similar to that of the above embodiment.

Figure 11:
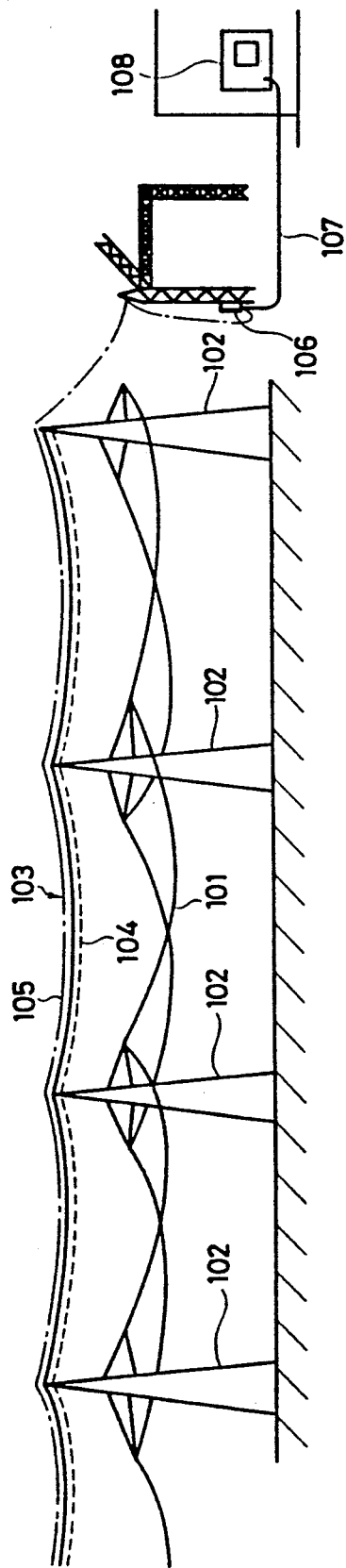
FIG. 11 schematically illustrates the structure of a struck point locating system according to still another embodiment of the present invention.

FIG. 11 schematically illustrates a struck point locating system according to still another embodiment of the present invention.

Referring to FIG. 11, a power line 101 is suspended from steel towers 102, which are installed at appropriate intervals. An optical fiber composite overhead ground wire or conductor 103 is mounted on upper parts of the steel towers 102 in parallel with the power line 101. The optical fiber composite overhead ground wire or conductor 103 contains a metal wire, a communication optical fiber cable 104 and a sensor optical fiber cable 105. An end portion of the sensor optical fiber cable 105 contained in the optical fiber composite overhead ground wire or conductor 103 is connected to a non-metallic optical fiber cable 107 through a junction box 106. The non-metallic optical fiber cable 107 is connected to a measuring device 108. This measuring device 108 transmits light to the sensor optical fiber cable 105 contained in the optical fiber composite overhead ground wire or conductor 103, to measure Raman scattering light sent back from the sensor optical fiber cable 105 and to detect a temperature distribution along the transmission line on the basis of the spectrum of the Raman scattering light. The measuring device 108 is an optical time domain reflector (OTDR), for example.

The operation of the locating system according to this embodiment will now be described.

When the optical fiber composite overhead ground wire or conductor 103 is struck by lightning, large current instantaneously flows in the struck point, to cause a temperature rise by Joule heat. Therefore, the struck point can be located by detecting the spot developing such a temperature rise. This embodiment utilizes the fact that the spectrum of the Raman scattering light of the light transmitted in the optical fiber cable has a temperature dependency.

Figure 12:
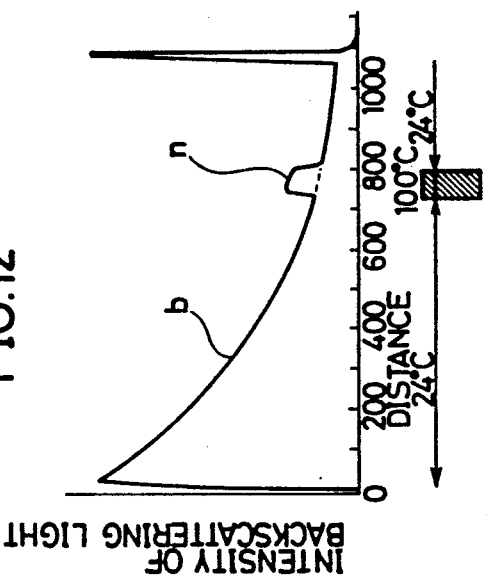
FIG. 12 illustrates a temperature dependency of the spectrum of backscattering light by a Raman effect.

FIG. 12 shows, as an example, the results of the measurement of the backscattering light by a Raman effect in the sensor optical fiber cable 105. Referring to FIG. 12, the horizontal axis or abscissa represents distance in meters m and the ordinate represents the intensity of the backscattering light by the Raman effect in the sensor optical fiber cable 105. According to FIG. 12, the temperature of a portion corresponding to a baseline b in the optical fiber composite overhead ground wire or conductor 103 is 24° C., and the temperature of a portion n which is higher in intensity than the base line b, is 100° C. In other words, a point of the optical fiber composite overhead ground wire or conductor 103 corresponding to the portion n shown in FIG. 12, has been struck by lightning.

As to the spectrum of the backscattering light by the Raman effect, it should be noted that the relationship between the light intensity and the temperature and the relationship between the transverse axis of the Raman spectrum and the distance, depend on the material of which the sensor optical fiber cable 105 is made. Therefore, these relationships are measured by the measuring device 108 prior to using the cable 105 to obtain a reference curve.

The sensor optical fiber cable 105 can be made of an ordinary communication optical fiber cable which is contained in the optical fiber composite overhead ground wire 103. In order to increase the detection sensitivity, a specific optical fiber cable which is made of a material having a strong temperature dependency of the backscattering light, may be inserted as a single conductor in the optical fiber composite overhead ground wire or conductor 103.

In the struck point locating system shown in FIG. 11, the junction box 106 is connected with the measuring device 108 by the non-metallic optical fiber cable 107, whereby no lightning caused current generated in the optical fiber composite overhead ground wire or conductor 103 reaches the measuring device 108.

Thus, the optical fiber composite overhead ground wire or conductor 103 laid as a communication path, itself can be used as a detection means for the struck point and as a transfer means for transferring the detected data in the struck point locating system according to the above embodiment, whereby there is no need to newly install detection means and transfer means for transferring detected data and the measuring device may be installed in one portion of the system. Therefore, the system is simplified in its structure, and its operation has been facilitated, thereby to reduce the price of the system.

The above embodiment utilizes the fact that the intensity of the Raman scattering light in the sensor optical fiber cable has a temperature dependency. However, the present invention is not limited to this feature but may utilize the fact that the quantity of light absorption in a sensor optical fiber cable has a temperature dependency, for example. In this case, the sensor optical fiber cable is made as an optical fiber cable made of a material having a temperature dependency of the quantity of light that can be absorbed by the cable.

Although the optical fiber cable contained in the optical fiber composite overhead ground wire is employed as the sensor optical fiber cable in the above embodiment, such a sensor optical fiber cable may be inserted in a power line such as an overhead power transmission or distribution line itself.

As hereinabove described, the following effects can be attained by the present invention. The presence or absence of a ground fault and a struck spot are detected through two independent detecting functions by respective detecting sections. Thus, even if one of the detectors functions insufficiently, the other detectors can compensate for an insufficient detecting operation of one of the detectors, to correctly locate the struck spot and/or a line section.

Therefore, even if the transmission line is merely struck by a lightning without causing a fault, servicemen need not patrol along the entire transmission line in order to detect the struck spot. In this case, the servicemen need to check only a detected spot or section to ascertain the damage caused in the overhead transmission line or the optical fiber cable by a lightning, whereby the damage of the optical fiber composite overhead ground wire can be reliably detected without much labor and time. Consequently, it is possible to prevent a fault such as a communication failure caused by the damage of the optical fiber cable.

Further, the present invention is adapted to detect phase differences between low-frequency components of a surge current. Thus, it is possible to easily detect a difference between current phases received from two spots with a simple detector structure. Even if different current detectors have different response abilities, it is possible to compensate for the difference to correctly detect a struck spot or section.

When the transmission line is struck by lightning causing a fault, the faulty spot or section is detected through the time difference detection method and through the phase difference detection method. In other words, the aforementioned structure can be readily expanded to a faulty point or section locating system. The overall transmission line is monitored through two independent functions also in this case, whereby it is possible to build a faulty spot/section locating system for a monitored transmission line having a high detection accuracy.

The aforementioned phase difference detectors may be replaced by elements for simply detecting phases and/or current levels of a surge current for transmitting respective data to a central monitoring station together with time difference data, thereby to build a faulty spot/section locating system having a high detection accuracy.

Further, a monitoring system may be so structured as to derive the desired detection data on the basis of current detection signals in one section and another section including this section to locate a faulty point or struck point through the derived detection data, thereby to further improve the locating accuracy.

In the system of locating a struck point on the basis of the distribution of the light intensity in an optical fiber cable, the optical fiber cable provided along the transmission line itself, is employed as a detection means for detecting a ground fault and as a transfer means for the detected data, whereby it is not necessary to provide detectors in respective sections of the transmission line, but detection means may be installed in one portion of the line only.

Thus, the system is simplified in its structure and its operation is facilitated, thereby to reduce the cost for the system.

Although the present invention has been described and illustrated in detail, it is clearly understood that the same is by way of illutration and example only and is not to be taken by way of limitation, the spirit and scope of the present invention being limited only by the terms of the appended claims.

What is claimed is:

1. A locating apparatus for locating a point struck by lightning in a transmission line, comprising: a plurality of current detecting means located at a plurality of prescribed spots along said transmission line for detecting a current flowing in said plurality of prescribed spots of said transmission line; time difference detection means receiving detected signals from those of said current detection means provided in two arbitrary spots within said plurality of prescribed spots for detecting a relative difference between arrival times of said detected signals; and phase difference detection means receiving said detection signals from said current detection means provided in said two arbitrary spots and for extracting low-frequency components of a predetermined frequency domain from said detected signals for detecting a phase difference between said extracted low-frequency components as an indication of a location of said point struck by lightning.

2. The locating apparatus in accordance with claim 1, wherein said transmission line includes an overhead ground wire, each of said plurality of current detection means detecting a current flowing in said overhead ground wire.

3. The locating apparatus in accordance with claim 1, wherein
said transmission line includes a power line,
each of said plurality of current detection means detecting a current flowing in said power line.

4. A locating system for locating a point struck by lightning in a transmission line, comprising: a plurality of current detecting means located at a plurality of prescribed spots along said transmission line for detecting a current flowing in said plurality of prescribed spots of said transmission line; a plurality of time difference detection means each receiving detected signals from said plurality of current detection means provided in two arbitrary spots for detecting a relative difference between arrival times of said detected signals; a plurality of phase difference detection means each receiving detected signals from those of said plurality of current detection means provided in said two arbitary spots for extracting low-frequency components of a predetermined frequency domain and for detecting phase difference between said extracted low-frequency components; and locating means receiving outputs from said plurality of time difference detection means and outputs from said plurality of phase difference detection means for locating said struck point in said transmission line on the basis of said received outputs.

5. The locating system in accordance with claim 4, wherein each of said time difference detection means receives detected signals from current detection means provided on both ends of a prescribed first section and detected signals from current detection means provided on both ends of a second section including said first section, for detecting a relative difference between arrival times of said detected signals in each of said first and second sections.

6. The locating system in accordance with claim 4, wherein each of said phase difference detection means receives detected signals from current detection means provided on both ends of a prescribed first section and detected signals from current detection means provided on both ends of a second section including said first section for extracting low-frequency components of a prescribed frequency domain from said detection signals in each of said first and second sections and for detecting a phase difference between said extracted low-frequency components.

7. The locating system in accordance with claim 4, wherein each of said time difference detection means receives detected signals from current detection means provided on both ends of a prescribed first section and detected signals from current detection means provided on both ends of a second section including said first section for detecting a relative time difference between arrival times of said detected signals in each of said first and second sections, and each of said phase difference detection means receives said detected signals from said current detection means provided on both ends of said prescribed first section and detected signals from said current detection means provided on both ends of said second section for extracting low-frequency components of a prescribed frequency domain from said detected signals in each of said first and section sections for detecting a phase difference between said extracted low-frequency components.

8. The locating system in accordance with claim 4, wherein
said transmission line includes an overhead ground wire,
each of said plurality of current detection means detecting a current flowing in said overhead ground wire.

9. The locating system in accordance with claim 4, wherein
said transmission line includes a power line,
each of said plurality of current detection means detecting a current flowing in said power line.

10. A faulty point locating apparatus for locating a faulty point in a transmission line, comprising: a plurality of current detection means provided in a plurality of respective prescribed spots in said transmission line for detecting a current flowing in said plurality of prescribed spots; time difference detection means receiving detected signals from said current detection means provided in two arbitrary spots within said plurality of prescribed spots for detecting a relative difference between arrival times of said detected signals; and phase difference/amplitude difference detection means receiving said detected signals from said current detection means provided in said two arbitrary spots for extracting low frequency components of a predetermined frequency domain from said detected signals received from said plurality of current detection means for detecting a phase difference and/or an amplitude difference between said received detected signals to provide an indication of the location of said faulty point.

11. A faulty point locating system for locating a faulty point in a transmission line, comprising: a plurality of current detection means provided in a plurality of prescribed spots of said transmission line for detecting a current flowing in said plurality of spots of said transmission line; a plurality of time difference detection means each receiving detected signals from said plurality of current detection means provided in two spots for detecting a relative difference between arrival times of said received detected signals; a plurality of phase difference/amplitude difference detection means each receiving detected signals from said plurality of current detection means provided in two arbitrary spots for detecting a phase difference and/or an amplitude difference between said received detected signals; and locating means receiving outputs from said plurality of time difference detection means and outputs from said plurality of phase difference/amplitude difference detection means for locating said faulty point in said transmission line on the basis of said received outputs, and wherein each of said plurality of phase difference/amplitude difference detection means receives detected signals from current detection means provided at both ends of a prescribed first section and detected signals from current detection means provided at both ends of a second section including said first section for extracting low-frequency components of a predetermined frequency domain from said detected signals in each of said first and second sections, thereby to detect a phase difference between said extracted low-frequency components.

12. The locating system in accordance with claim 11, wherein each of said plurality of time difference detection means receives detected signals from current detection means provided at both ends of a prescribed first section and detected signals from current detection means provided at both ends of a second section including said first section for detecting a relative difference between arrival times of said detected signals in each of said first and second sections.

13. The locating system in accordance with claim 11, wherein
said transmission line includes an overhead ground wire,
each of said plurality of current detection means detecting a current flowing in said overhead ground wire.

14. The locating system in accordance with claim 11, wherein
said transmission line includes a power line,
each of said plurality of current detection means detecting a current flowing in said power line.

15. A method for locating a faulty point that has been struck by lightning in a transmission line, comprising the steps of: detecting currents flowing in a plurality of prescribed spots of said transmission line by a plurality of current detection means to provide respective detected signals; receiving said detected signals from said current detection means provided in two arbitrary spots within said plurality of prescribed spots and detecting a relative difference between arrival times of said detected signals; extracting low-frequency components of a predetermined frequency domain from said detected signals received from said two current detection means and detecting a phase difference between said extracted low-frequency components; and locating said faulty point in said transmission line on the basis of said detected relative time difference and said detected phase difference.

* * * * *